(12) United States Patent
Chen et al.

(10) Patent No.: US 11,024,506 B2
(45) Date of Patent: Jun. 1, 2021

(54) SEMICONDUCTOR STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Liang Chen, Shanghai (CN); Chao Feng Zhou, Shanghai (CN); Xiao Bo Li, Shanghai (CN); Xiao Yan Zhong, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 43 days.

(21) Appl. No.: 16/289,298

(22) Filed: Feb. 28, 2019

(65) Prior Publication Data

US 2019/0272996 A1 Sep. 5, 2019

(30) Foreign Application Priority Data

Mar. 5, 2018 (CN) .......................... 201810179086.7

(51) Int. Cl.
*H01L 21/28* (2006.01)
*H01L 21/285* (2006.01)
(Continued)

(52) U.S. Cl.
CPC .. *H01L 21/28518* (2013.01); *H01L 21/28052* (2013.01); *H01L 21/324* (2013.01);
(Continued)

(58) Field of Classification Search
CPC ......... H01L 21/28518; H01L 21/28052; H01L 21/324; H01L 21/32139; H01L 21/823443;
(Continued)

(56) References Cited

U.S. PATENT DOCUMENTS

| 10,559,690 | B2 * | 2/2020 | Basker ................ H01L 29/7848 |
| 2004/0002185 | A1 * | 1/2004 | Takahashi ....... H01L 21/823842 438/224 |

(Continued)

*Primary Examiner* — Natalia A Gondarenko
(74) *Attorney, Agent, or Firm* — Anova Law Group, PLLC

(57) ABSTRACT

A fabrication method for a semiconductor structure is provided. The method includes: forming a base substrate; forming gate structures on the base substrate where each gate structure includes a first gate portion with first doping ions on the base substrate and a second gate portion on the first gate portion; forming a metal layer on the second gate portions; and forming a metal silicide layer by reacting a portion of the metal layer with each second gate portion through an annealing process. When forming the metal silicide layers, a reaction between the metal layer and the second gate portions has a first reacting rate and a reaction between the metal layer and the first gate portions has a second reacting rate; and the second reacting rate is smaller than the first reacting rate.

11 Claims, 4 Drawing Sheets

(51) Int. Cl.
*H01L 21/324* (2006.01)
*H01L 21/3213* (2006.01)
*H01L 29/78* (2006.01)
*H01L 29/49* (2006.01)
*H01L 29/51* (2006.01)

(52) U.S. Cl.
CPC .... *H01L 21/32139* (2013.01); *H01L 29/4933* (2013.01); *H01L 29/517* (2013.01); *H01L 29/7851* (2013.01)

(58) Field of Classification Search
CPC ..... H01L 21/823437; H01L 21/823828; H01L 21/823825; H01L 29/517; H01L 29/7851; H01L 29/4925; H01L 29/4933; H01L 29/785; H01L 29/66484; H01L 29/665–66507; H01L 29/7831; H01L 21/28; H01L 21/2807; H01L 21/76841; H01L 21/76843; H01L 21/76847; H01L 21/7685; H01L 21/76864
USPC .......... 257/88, 288, 368; 438/197, 649, 651, 438/149, 224, 228, 631, 588, 591, 592, 438/594, 653
See application file for complete search history.

(56) References Cited

U.S. PATENT DOCUMENTS

| | | | |
|---|---|---|---|
| 2006/0121660 A1* | 6/2006 | Rhee | H01L 21/28052 438/197 |
| 2006/0249800 A1* | 11/2006 | Tanaka | H01L 21/3185 257/413 |
| 2009/0325371 A1* | 12/2009 | Kim | H01L 27/11521 438/588 |
| 2013/0260554 A1* | 10/2013 | Kim | H01L 27/11573 438/653 |

* cited by examiner

SEMICONDUCTOR STRUCTURE AND FABRICATION METHOD THEREOF

CROSS-REFERENCES TO RELATED APPLICATION

This application claims the priority of Chinese Patent Application No. 201810179086.7, filed on Mar. 5, 2018, the content of which is incorporated herein by reference in its entirety.

TECHNICAL FIELD

The present disclosure generally relates to the field of semiconductor technologies and, more particularly, relates to a semiconductor structure and its fabrication method.

BACKGROUND

Complementary metal oxide semiconductor (CMOS) transistors are widely used in all kinds of integrated circuits as most fundamental devices. The complementary metal oxide semiconductor transistors are divided into NMOS transistors and PMOS transistors according to different types of majority carriers and different doping types used in fabrication processes. The transistors include gate structures.

When forming a CMOS transistor, a metal silicide layer is formed on a top surface of a gate structure for improving a contact resistance between the gate structure and a subsequent conductive plug in the gate structure. However, the metal silicide layer formed by current technologies has a poor performance.

SUMMARY

One aspect of the present disclosure provides a fabrication method of a semiconductor structure. The method includes: forming a base substrate; forming gate structures on the base substrate where each gate structure includes a first gate portion with first doping ions on a top surface of the base substrate and a second gate portion on a top surface of the first gate portion; forming a metal layer on top surfaces of the second gate portions; and forming a metal silicide layer by reacting a portion of the metal layer with each second gate portion through an annealing process. When forming the metal silicide layers, a reaction between the metal layer and the second gate portions has a first reacting rate and a reaction between the metal layer and the first gate portions has a second reacting rate; and the second reacting rate is smaller than the first reacting rate.

Another aspect of the present disclosure provides a semiconductor structure. The semiconductor structure includes a base substrate and gate structures on the base substrate. Each gate structure includes a first gate portion with first doping ions on a top surface of the base substrate and a second gate portion on a top surface of the first gate portion. The first gate portions include first doping ions.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
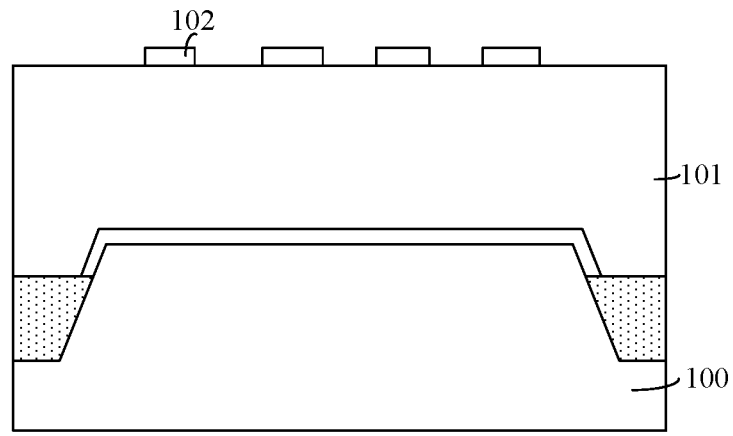
FIGS. 1-3 illustrate semiconductor structures corresponding to certain stages for forming a semiconductor structure.
Figure 2:
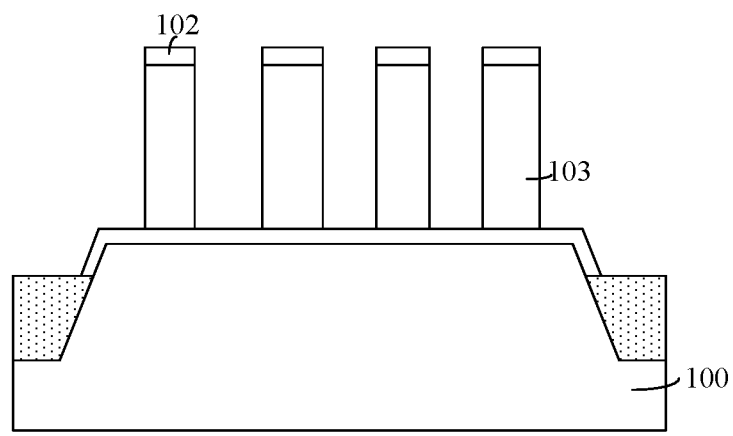
Figure 3:
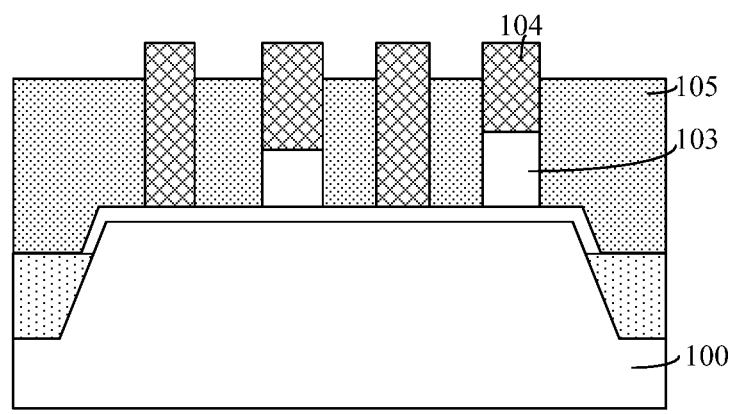

FIGS. 1-3 illustrate semiconductor structures corresponding to certain stages for forming a semiconductor structure.

As illustrated in FIG. 1, a substrate 100 may be provided and a gate material layer 101 may be formed on a top surface of the substrate 100. A mask layer 102 may be formed on a top surface of the gate material layer 101 and may include a plurality of mask openings.

As illustrated in FIG. 2, the gate material layer 101 may be etched by using the mask layer 102 as a mask, to expose the top surface of the substrate 100 and to form a plurality of gate layers 103.

As illustrated in FIG. 3, a dielectric layer 105 may be formed on the top surface of the substrate 105, on sidewalls of the plurality of gate layers 103, and on top surfaces of the plurality of gate layers 103. A portion of the dielectric layer 105 may be removed to expose a top surface of the mask layer 102. After removing a portion of the dielectric layer 105, the mask layer 102 may be removed to expose the top surfaces of the plurality of gate layers 103. A metal layer may be formed on top surfaces of the plurality of gate layer 103. An annealing process may be performed on the metal layer to form a metal silicide layer 104 by reacting the metal layer with each of the plurality of gate layer 103.

In the above fabricating method, a size of the mask layer 102 along a direction perpendicular to the sidewalls of the plurality of gate layers 103 may determine a width of the plurality of gate layers 103 since the mask layer 102 is used as the mask for forming the plurality of gate layers 103. In practical fabrication processes, the size of the mask layer 102 along a direction perpendicular to the sidewalls of the plurality of gate layers 103 may be non-uniform, and the width of each of the plurality of gate layers 103 formed by etching the gate material layer 101 using the mask layer 102 as the mask may be non-uniform. When each of the plurality of gate layers 103 with a different width react with the corresponding metal layer having a same amount subsequently, one metal silicide layer 104 formed by one of the plurality gate layers 103 with a larger width may have a small thickness reacting with one corresponding metal layer while another metal silicide layer 104 formed by one of the plurality gate layers 103 with a larger width reacting with one corresponding metal layer may have a large thickness. A difference between heights of the metal silicide layers 104 may be large. Correspondingly, a difference between resistances of the metal silicide layers 104 on the tops of different gate layers 103 may be large. The formed semiconductor structure may have a poor uniformity and a poor performance.

The present disclosure provides a semiconductor structure and a fabricating method for forming the semiconductor structure. The method may include forming a plurality of gate structures on a base substrate. Each of the plurality of gate structure may include a first gate portion on the substrate and a second gate portion on the first gate portion. The first gate portion may include doping ions and the second gate portion may be used to limit a height of a corresponding metal silicide layer. The formed semiconductor structure may have a good uniformity of heights of the metal silicide layers.

Figure 8:
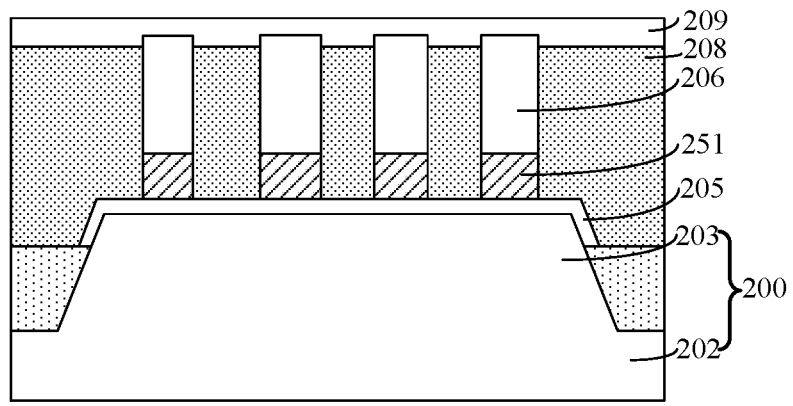
Figure 9:
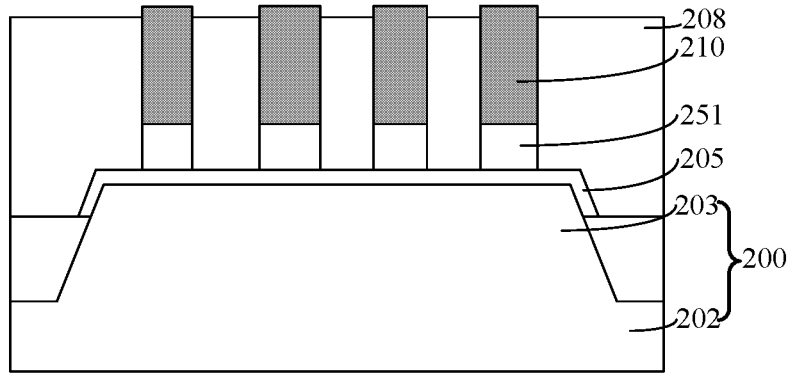
Figure 10:
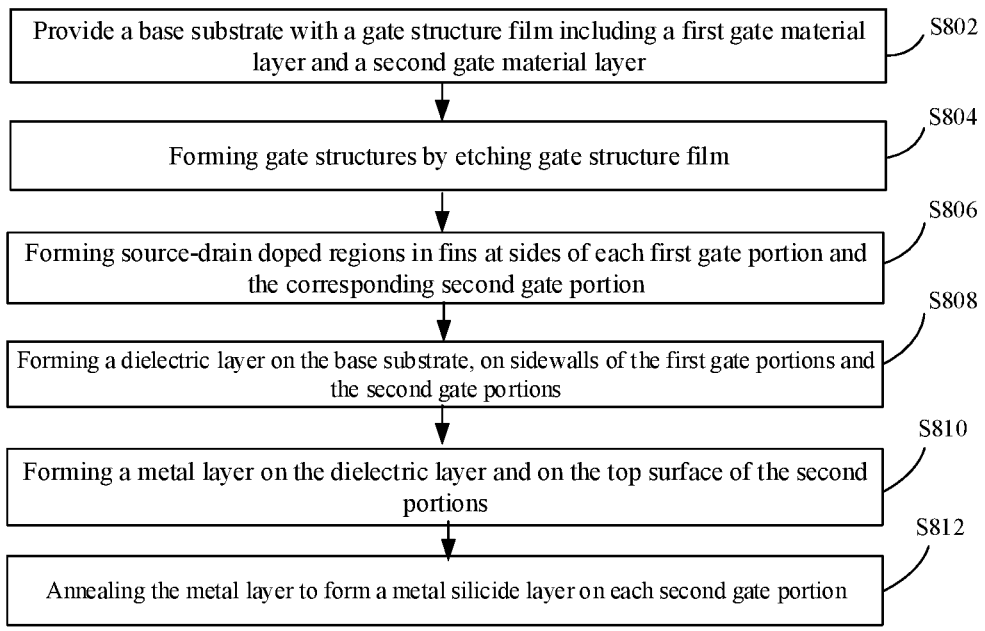
FIG. 10 illustrates an exemplary method for forming an exemplary semiconductor structure according to various disclosed embodiments of the present disclosure.

FIGS. 4-9 illustrate semiconductor structures corresponding to certain stages for forming an exemplary semiconductor structure according to various disclosed embodiments of the present disclosure; and FIG. 10 illustrates an exemplary method for forming an exemplary semiconductor structure according to various disclosed embodiments of the present disclosure.

Figure 4:
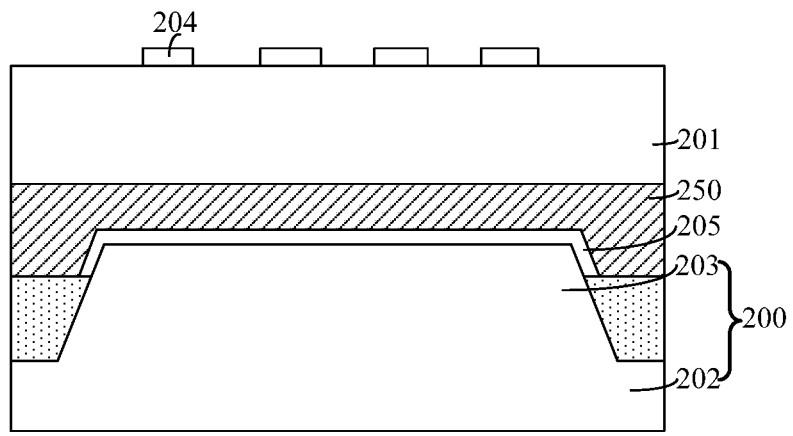
FIGS. 4-9 illustrate semiconductor structures corresponding to certain stages for forming an exemplary semiconductor structure according to various disclosed embodiments of the present disclosure.

As illustrated in FIG. 4, a base substrate 200 may be provided. A first gate material layer 250 may be formed on the base substrate 200 and a second gate material layer 201 may be formed on the first gate material layer 250 (e.g., Step S802 in FIG. 10). The first gate material layer 250 may be doped with first doping ions.

In one embodiment, the base substrate 200 may include a substrate 202 and fins 203 on a top surface of the substrate 202. In other embodiments, the base substrate 200 may be a planar substrate including a silicon substrate, a germanium substrate, and/or a silicon germanium substrate.

In one embodiment, the substrate 202 and the fins 203 may be formed by: providing an initial substrate; forming a mask layer on a top surface of the initial substrate to expose a portion of the top surface of the initial substrate; and etching the initial substrate by using the mask layer as a mask, to form the substrate 202 and the fins 203 on the top surface of the substrate 202.

In one embodiment, the initial substrate may be made of a material including silicon. Correspondingly, the substrate 202 and the fins 203 may be made of a material including silicon.

In some other embodiments, the initial substrate may be a germanium substrate, a silicon germanium substrate, a silicon-on-insulator substrate, and/or a germanium-on-insulator substrate. The substrate 202 and the fins 203 may be made of a same or different material, including germanium, silicon germanium, silicon-on-insulator, and/or germanium-on-insulator.

The mask layer, used for forming the substrate 202 and the fins 203, may be made of a material including silicon nitride and/or TiN. The initial substrate may be etched for example, by a dry etching method, a wet etching method, or a combination thereof.

The first gate material layer 250 may be made of a material including silicon, and the first doping ions may include carbon ions. The first gate material layer 250 may be formed by a chemical vapor deposition process. The chemical vapor deposition process may use a reactant gas including a silicon source and a carbon source. The silicon source may include silane with a gas flow of about 100 cm$^3$/min to about 500 cm$^3$/min. The carbon source may include ethylene with a gas flow of about 300 cm$^3$/min to about 1500 cm$^3$/min.

The first gate material layer 250 may be used to form subsequent first gate portions and a thickness of the first gate material layer 250 may determine a height of each first gate portion.

The second gate material layer 201 may be made of a material including silicon and may be formed by a chemical vapor deposition process or a physical vapor deposition process.

The second gate material layer 201 may be used to form subsequent second gate portions and a thickness of the second gate material layer 201 may determine a height of each second gate portion.

A ratio between the thickness of the second gate material layer 201 and the thickness of the first gate material layer 250 may be about 3:2 to about 4:1. The ratio between the thickness of the second gate material layer 201 and the thickness of the first gate material layer 250 may determine a ratio between the height of each second gate portion and the height of each first gate portion.

In one embodiment, the second gate material layer 201 may be doped with first doping ions including phosphorus ions. In other embodiments, the second gate material layer 201 may not be doped with the first doping ions.

A first mask layer 204 may be formed on the second gate material layer 201. The first mask layer 204 may include a plurality of mask openings. The first mask layer 204 may determine positions and sizes of subsequent first gate portions and second gate portions.

The first mask layer 204 may be formed by: forming a first mask material layer on the second gate material layer 201; forming a patterned photoresist the first mask material layer; and forming the first mask layer 204 by etching the first mask material layer using the patterned photoresist as a mask to expose the top surface of the second gate material layer 201. The formed first mask layer 204 may include a plurality of mask openings.

When patterning the photoresist, a size of the patterned photoresist may not be uniform because of limits in the fabrication process. When subsequently forming the first mask layer 204 by etching the first mask material layer using the patterned photoresist as the mask, a size of the first mask layer 204 may not be uniform. Correspondingly, when etching the second gate material layer 201 and the first gate material layer 250 by using the first mask layer 204 as the mask, a width of the formed first gate portions and the formed second gate portions may not be uniform.

The first mask material layer may be etched using the patterned photoresist as a mask, by a dry etching method, a wet etching method, or a combination thereof.

A gate dielectric layer 205 may be formed on a portion of sidewalls and a portion of a top surface of each of the plurality of fins 203.

The gate dielectric layers 205 may be made of a material including silicon oxide and may be formed by a chemical vapor deposition process or a physical vapor deposition process.

The first gate material layer 250 and the second gate material layer 201 may form a gate structure film together.

Figure 5:
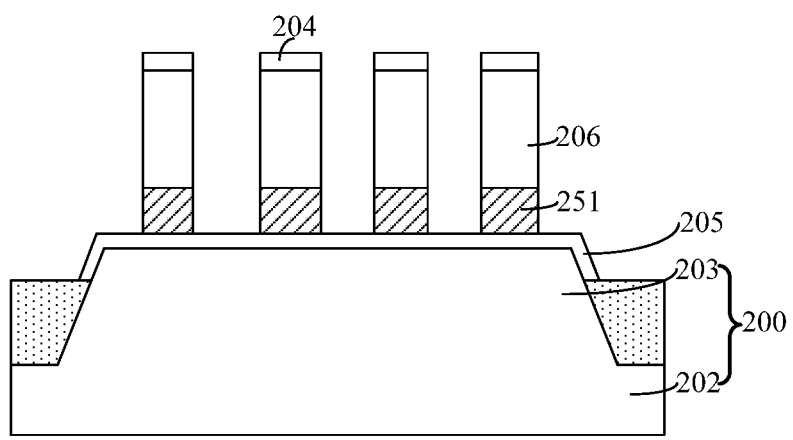

As illustrated in FIG. 5, gate structures may be formed by etching the gate structure film using the first mask layer 204 as the mask to expose top surfaces of the plurality of fins 203 (e.g., Step S804 in FIG. 10). Each gate structure may include a first gate portion 251 on one corresponding fin 203 and a second gate portion 206 on the first gate portion 251. The first gate portion 251 may be doped with the first doping ions.

The gate structure film may be etched using the first mask layer 204 as the mask, by a dry etching method, a wet etching method, or a combination thereof.

The size of the first mask layer 204 may not be uniform, and a width of the gate structures formed by etching the gate structure film using the first mask layer 204 as the mask may not be uniform too. But a height of the formed second gate portions 206 may be highly uniform. Each second gate portion 206 may be metalized completely to form a metal silicide layer, and then height of the formed metal silicide layers may be highly uniform. A difference between resistances of the formed metal silicide layers 210 may be small and performance of the formed semiconductor structure may be improved.

A ratio between the height of the second gate portions 206 and a height of the first gate portions 251 may be about 3:2 to about 4:1. If the ratio between the height of the second gate portions 206 and the height of the first gate portions 251 is smaller than 3:2, a resistance of each second gate portion 206 and the corresponding first gate portion 251 as a whole may be too large, and the formed semiconductor structure may have a poor performance. If the ratio between the height of the second gate portions 206 and the height of the first gate portions 251 is larger than 4:1, a resistance in each second gate portion 206 without first doping ions may be inhomogeneous because the height of the second gate portions 206 is too large. The formed semiconductor structure may have a poor performance.

After forming the first gate portions 251 and the second gate portions 206, source-drain doped regions may be formed in fins at sides of each first gate portion 251 and the corresponding second gate portion 206 (e.g., Step S806 in FIG. 10).

The source-drain doped regions may be formed by: forming source-drain openings in the fins 203 at sides of each first gate portion 251 and the corresponding second gate portion 206; forming an epitaxial layer in each source-drain opening; and forming a source-drain doped region by doping each epitaxial layer with source-drain ions.

The source-drain openings may be formed by a dry etching method, a wet etching method, or a combination thereof.

The source-drain ions and a material of the epitaxial layers may be determined by a type of formed transistors.

In one embodiment, the formed transistors may be NMOS transistors. Correspondingly, the epitaxial layers may be made of a material including SiC and/or Si, and the source-drain ions may be N-type ions including phosphorus ions and/or arsenic ions.

In other embodiments, the formed transistors may be PMOS transistors. Correspondingly, the epitaxial layers may be made of a material including SiGe and/or Si, and the source-drain ions may be P-type ions including boron ions.

Figure 6:
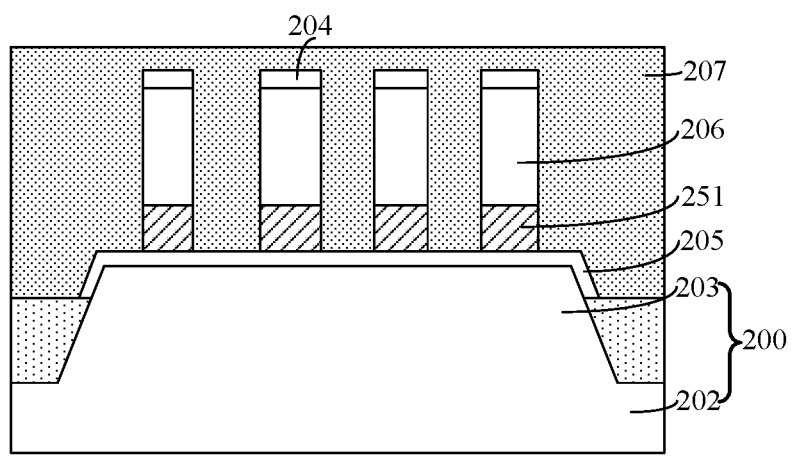

As illustrated in FIG. 6, after forming the source-drain doped regions, a dielectric film 207 may be formed on the base substrate 200, on sidewalls of the first gate portions 251, on top surfaces of the first gate portions 251, on sidewalls of the second gate portions 206, and on top surfaces of the second gate portions 206 (e.g., Step S808 in FIG. 10).

The dielectric film 207 may be made of a material including Sift and/or SiNO. The dielectric film 207 may be formed by a chemical vapor deposition process or a physical vapor deposition process.

The dielectric film 207 may be used to form a dielectric layer subsequently.

Figure 7:
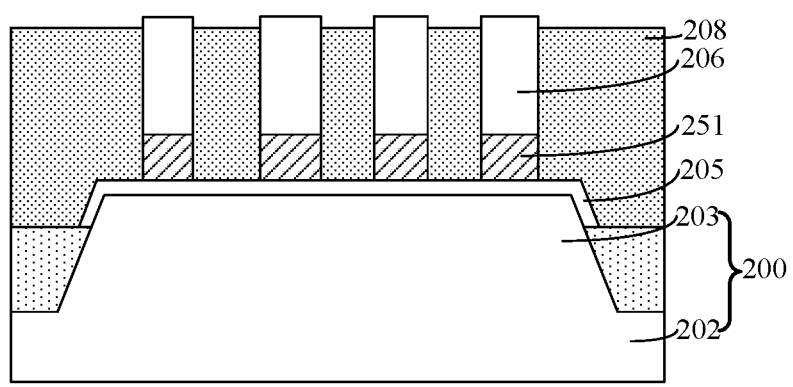

As illustrated in FIG. 7, a portion of the dielectric film 207 may be removed until exposing the top surface of the first mask layer, to form a dielectric layer 208. After forming the dielectric layer 208, the first mask layer 204 may be removed to expose the top surfaces of the second gate portions 206 (e.g., Step S810 in FIG. 10).

The portion of the dielectric film 207 may be removed by a dry etching method, a wet etching method, or a combination thereof.

Removing the portion of the dielectric film 207 to expose the top surface of the first mask layer 204 may benefit subsequent removing of the first mask layer 204 to expose the top surfaces of the second gate portions 206. Subsequently formed metal layers can contact the second gate portions 206, and a reaction between the metal layers and the second gate portions 206 to form metal silicide layers may be improved.

The first mask layer 204 may be removed by a dry etching method, a wet etching method, or a combination thereof.

As illustrated in FIG. 8, a metal layer 209 may be formed on a top surface of the dielectric layer 208 and on the top surfaces of the second gate portions 206 (e.g., Step S810 in FIG. 10).

In one embodiment, the metal layer 209 may be made of nickel. In other embodiments, the metal layer 209 may be made of a material including titanium and/or platinum.

The metal layer 209 may be formed by a chemical vapor deposition process or a physical vapor deposition process.

The metal layer 209 may react with the second gate portions 206 to form metal silicide layers.

As illustrated in FIG. 9, the fabrication method may further include forming a metal silicide layer 210 by an annealing process to make each second gate portions 206 react with the metal layer 209 (e.g., Step S812 in FIG. 10).

When forming the metal silicide layers 210, the metal layer 209 may react with the second gate portions 206 by a first reacting rate, and the metal layer 209 may react with the first gate portions 251 by a second reacting rate. The second reacting rate may be smaller than the first reacting rate.

After forming the metal silicide layers 210, an unreacted portion of the metal layer 209 may be removed.

In one embodiment, the metal silicide layers 210 may be made a material including silicon-nickel compound. In other embodiments, the metal silicide layers 210 may be made a material including a titanium-silicon compound and/or platinum-silicon compound.

The annealing process may be a rapid annealing process.

In one embodiment, the annealing process may be a rapid annealing process using a temperature of about 200° C. to about 400° C. and an annealing time of about 1 minute to about 3 minutes.

Each second gate portion 206 may be completely metalized to form the one corresponding metal silicide layer 210. A height of one metal silicide layer 210 may be determined by the one corresponding second gate portion 206, and a ratio between the height of the metal silicide layers 210 and the height of the first gate portions 251 may be about 3:2 to about 4:1.

Since the height of the second gate portions 206 may be highly uniform and the height of one metal silicide layer 210 may be determined by the one corresponding second gate portion 206, the height of the metal silicide layers 210 may be highly uniform. A difference between resistances of the formed metal silicide layers 210 may be small and performance of the formed semiconductor structure may be improved.

When forming the metal silicide layers 210, the reaction between the metal layer 209 and the second gate portions 206 may have the first reacting rate, and the reaction between the metal layer 209 and the first gate portions 251 may have the second reacting rate. The second reacting rate may be smaller than the first reacting rate, and the second gate portions 206 may be metalized to form the metal silicide layers 210.

If a height of each second gate portion 206 is different, a second gate portion 206 with a smaller width may be completely metalized to form the one corresponding metal silicide layer 210 earlier one of the other second gate portions with a larger width. After a second gate portion 206 with a smaller width is completely metalized to form the one corresponding metal silicide layer 210, the metal layer 209 may contact the one corresponding first gate portion 251. However, the first gate portions 251 may include the first doping ions. The first doping ions may make the first gate portions 251 include small atom clusters, and Van der Waals forces between neighbor atom clusters may be large. It is hard for the metal layer 209 to break the Van der Waals force between neighbor atom clusters, and binding forces between the metal layer 209 and the first gate portions 251 may be small. Correspondingly, the second reacting rate may be small and a portion of the first gate portions 251 metalized by the metal layer 209 may be small. The height of one metal silicide layer 210 may be determined by the one corresponding second gate portion 206. Since the height of the second gate portions 206 may be highly uniform, the height of the metal silicide layers 210 may be highly uniform too. A difference between resistances of the formed metal silicide layers 210 may be small and a performance of the formed semiconductor structure may be improved.

The present disclosure also provides a semiconductor structure formed by the above method. As illustrated in FIG. 9, the semiconductor structure may include: a base substrate 200 and gate structures on a top surface of the base substrate 200. Each gate structure may include a first gate portion 251 on the top surface of the base substrate 200 and a metal silicide layer 210 on a top surface of the first gate portion 251. The first gate portion 251 may be doped with first doping ions.

The first gate portions 251 may be made of a material including silicon and the first doping ions may include carbon ions. A ratio between a height of each metal silicide layers and a height of the corresponding first gate portion 251 may be about 3:2 to about 4:1.

The metal silicide layers 210 may be made of a material including silicon-nickel compound, titanium-silicon compound, and/or platinum-silicon compound.

The semiconductor structure may further include a dielectric layer 208 on the top surface of the base substrate 200. The dielectric layer 208 may cover a portion of sidewalls of the first gate portions 251 and a portion of sidewalls of the metal silicide layers 210. The dielectric layer 208 may be made of a material including silicon oxide.

In the present disclosure, the first gate portions may include the first doping ions. The first doping ions may make the first gate portions include small atom clusters, and Van der Waals forces between neighbor atom clusters may be large. It is hard for the metal layer to break the Van der Waals force between neighbor atom clusters, and binding forces between the metal layer and the first gate portions 251 may be small. Correspondingly, the second reacting rate may be small and a portion of the first gate portions metalized by the metal layer may be small. The height of one metal silicide layer may be determined by the one corresponding second gate portion 206. Since the heights of the second gate portions may be highly uniform, the heights of the metal silicide layers may be highly uniform too. A difference between resistances of the formed metal silicide layers may be small and a performance of the formed semiconductor structure may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor structure, comprising:
   forming a base substrate;
   forming gate structures on the base substrate, wherein each gate structure includes a first gate portion with first doping ions on the base substrate and a second gate portion without the first doping ions on the first gate portion;
   forming a dielectric layer on the base substrate, covering sidewalls of first gate portions of the gate structures and lower portion sidewalls of second gate portions of the gate structures, and exposing higher portion sidewalls of the second gate portions of the gate structures and top surfaces of the second gate portions of the gate structures;
   forming a metal layer on the top surfaces of the second gate portions of the gate structures, the higher portion sidewalls of the second gate portions of the gate structures, and a planar top surface of the dielectric layer, wherein the metal layer fills up gaps between adjacent gate structures and has a planar top surface higher than the top surfaces of the second gate portions of the gate structures;
   forming a metal silicide layer by reacting a portion of the metal layer with each second gate portion through an annealing process; and
   removing remaining unreacted portion of the metal layer, wherein:
   during forming the metal silicide layers, a reaction between the metal layer and the second gate portions of the gate structures has a first reacting rate and a reaction between the metal layer and the first gate portions of the gate structures has a second reacting rate;
   the second reacting rate is smaller than the first reacting rate; and
   a ratio between a height of the metal silicide layer and a height of the first gate portions of the gate structures is about 3:2 to about 4:1.

2. The method according to claim 1, wherein:
   the first gate portions of the gate structures are made of a material including silicon;
   the first doping ions include carbon ions; and
   the second gate portions of the gate structures are made of a material including silicon.

3. The method according to claim 2, wherein:
   the first gate portions of the gate structures are formed by a chemical vapor deposition process; and
   the chemical vapor deposition process uses a reactant gas including a silicon source and a carbon source, wherein:
   the silicon source includes silane with a gas flow rate of about 100 $cm^3$/min to about 500 $cm^3$/min; and
   the carbon source includes ethylene with a gas flow rate of about 300 $cm^3$/min to about 1500 $cm^3$/min.

4. The method according to claim 1, wherein a ratio between a height of the second gate portions of the gate structures and the height of the first gate portions of the gate structures is about 3:2 to about 4:1.

5. The method according to claim 1, wherein:
the metal layer is made of a material including at least one of nickel, titanium, or platinum;
the second gate portions of the gate structures are made of a material including silicon; and
the metal silicide layer is made of a material including a silicon-nickel compound, a titanium-silicon compound, or a platinum-silicon compound.

6. The method according to claim 1, wherein:
the annealing process is a rapid annealing process using:
a temperature of about 200° C. to about 400° C.; and
an annealing time of about 1 minute to about 3 minutes.

7. The method according to claim 1, wherein each second gate portion completely reacts with the metal layer to form the metal silicide layer.

8. The method according to claim 1, wherein:
the dielectric layer is formed after forming the first gate portions of the gate structures and the second gate portions of the gate structures, and before forming the metal layer, and
the dielectric layer is made of a material including silicon oxide.

9. The method according to claim 1, wherein:
the base substrate includes a substrate and fins on a top surface of the substrate,
a gate dielectric layer is formed on a portion of sidewalls and a portion of a top surface of each of the fins, and
the gate structures are formed across the gate dielectric layer.

10. The method according to claim 8, wherein:
the dielectric layer has a planar top surface lower than the top surfaces of the second gate portions and higher than a top surface of the first gate portions.

11. The method according to claim 10, wherein:
the metal layer has a top surface higher than the top surfaces of the second gate portions.

* * * * *